(12) United States Patent
Hsu

(10) Patent No.: US 10,866,266 B2
(45) Date of Patent: Dec. 15, 2020

(54) PROBE HEAD RECEIVER AND PROBE CARD ASSEMBLY HAVING THE SAME

(71) Applicant: TAIWAN SEMICONDUCTOR MANUFACTURING COMPANY LTD., Hsinchu (TW)

(72) Inventor: Ming-Cheng Hsu, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 373 days.

(21) Appl. No.: 14/926,513

(22) Filed: Oct. 29, 2015

(65) Prior Publication Data
US 2017/0122984 A1    May 4, 2017

(51) Int. Cl.
*G01R 1/073* (2006.01)

(52) U.S. Cl.
CPC ..... *G01R 1/07371* (2013.01); *G01R 1/07314* (2013.01)

(58) Field of Classification Search
None
See application file for complete search history.

(56) References Cited

U.S. PATENT DOCUMENTS

| | | | | |
|---|---|---|---|---|
| 6,636,061 B1* | 10/2003 | Crook | ................ | G01R 1/07371 |
| | | | | 324/756.04 |
| 2008/0150564 A1* | 6/2008 | Schmid | .............. | G01R 1/07371 |
| | | | | 324/750.24 |
| 2012/0319711 A1* | 12/2012 | Hung | ................. | G01R 1/07371 |
| | | | | 324/750.16 |
| 2014/0203829 A1* | 7/2014 | Yamada | ............. | G01R 31/2863 |
| | | | | 324/750.08 |
| 2015/0054537 A1* | 2/2015 | Taber, Jr. | ........... | G01R 1/07314 |
| | | | | 324/750.25 |

FOREIGN PATENT DOCUMENTS

JP          09274054 A    * 10/1997    ......... G01R 1/07357

\* cited by examiner

*Primary Examiner* — Paresh Patel
(74) *Attorney, Agent, or Firm* — WPAT, P.C., Intellectual Property Attorneys; Anthony King

(57) ABSTRACT

The present disclosure relates to a probe head receiver, which includes: a first template, a guide plate and a spacer. The first template has a number of apertures of a first size. The guide plate has a number of apertures of a second size, each of the number of apertures of the first template is aligned with each of the number of apertures of the guide plate. The spacer is between the first template and the guide place. The second size is different from the first size.

20 Claims, 10 Drawing Sheets

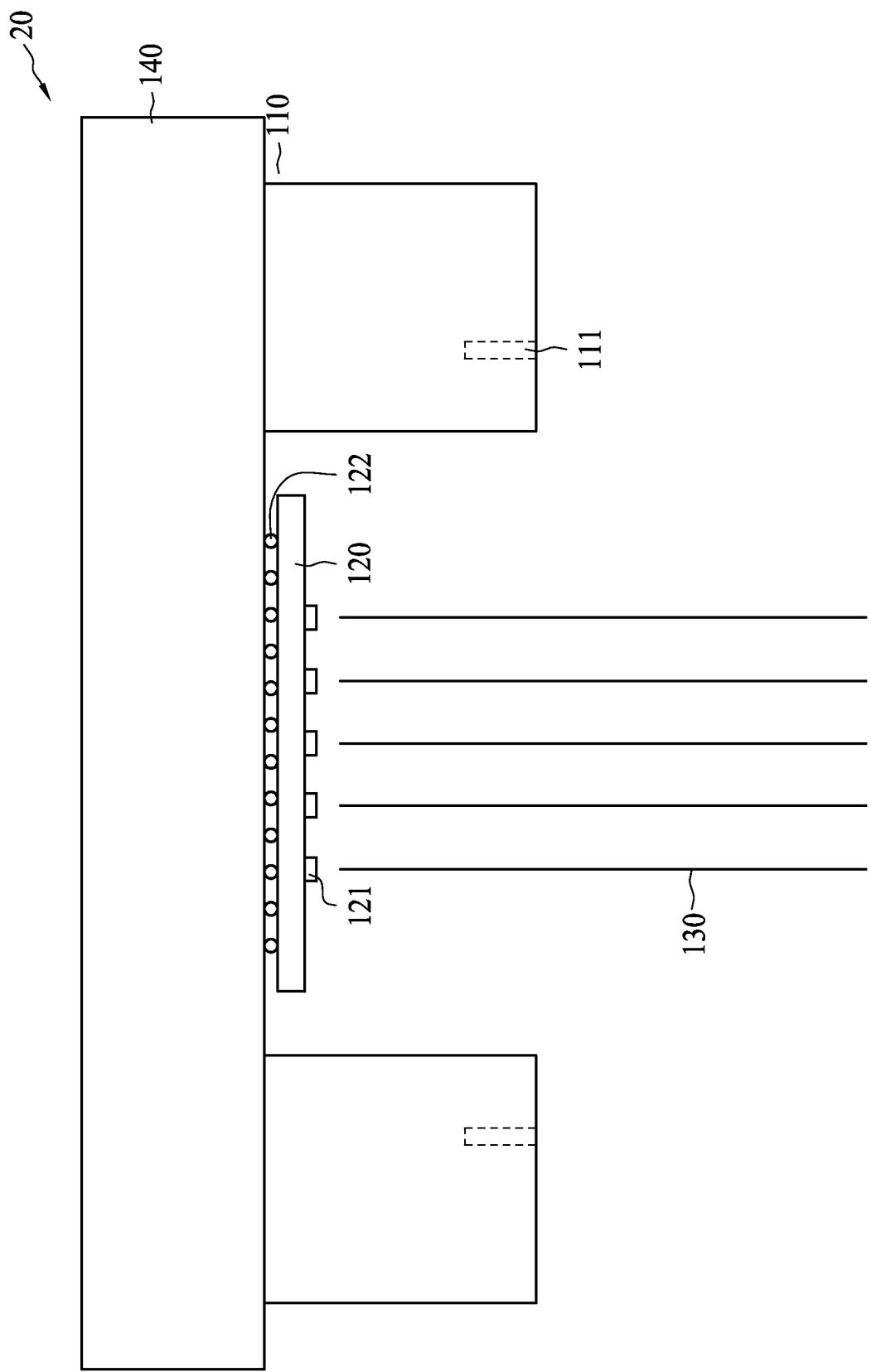

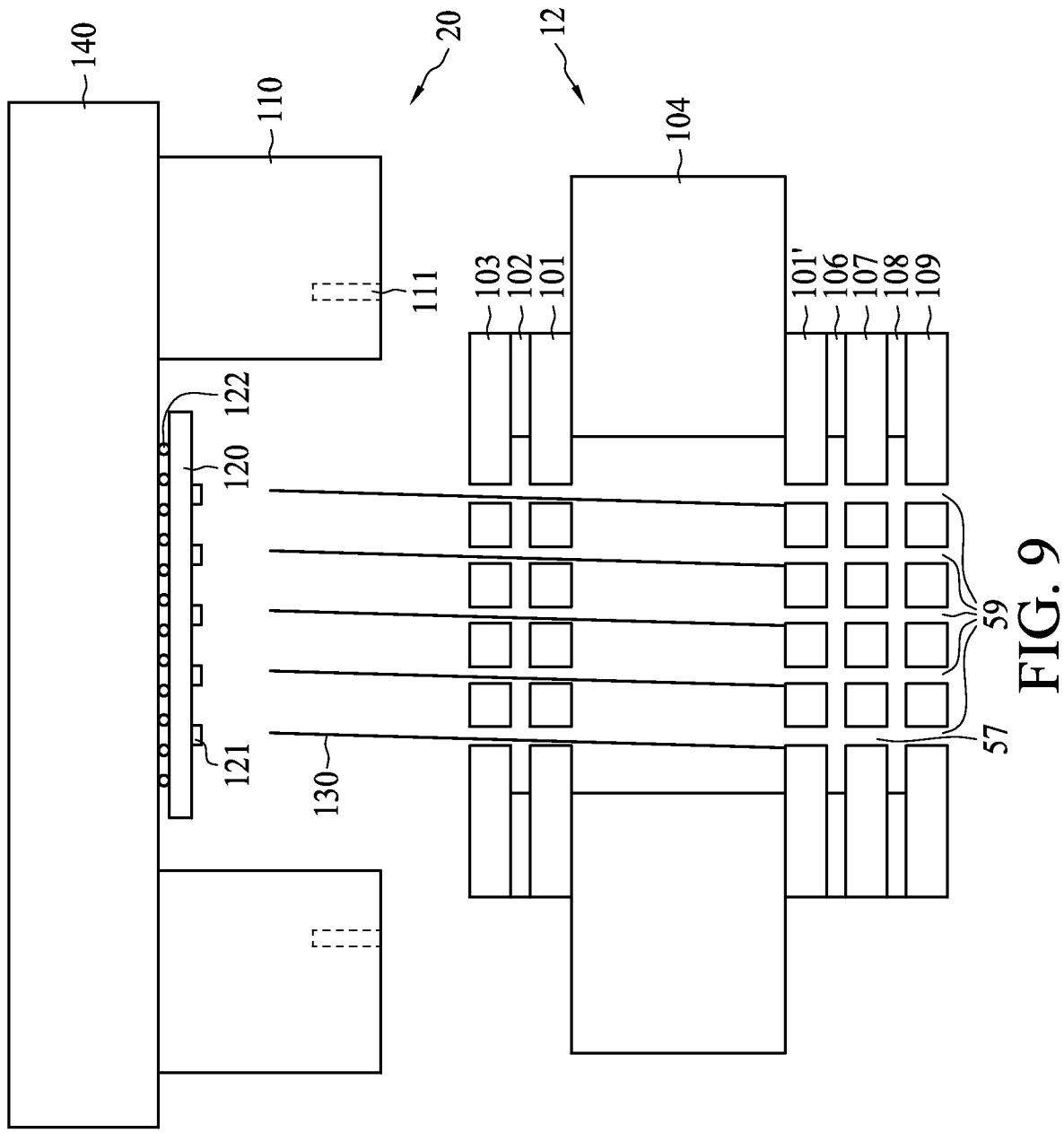

PROBE HEAD RECEIVER AND PROBE CARD ASSEMBLY HAVING THE SAME

BACKGROUND

Quality verification of an integrated circuit is required in various stages of manufacture. A probe card assembly, which has a number of probe pins, may be used to perform quality verification on the integrated circuit. Probe pins of the probe card assembly may contact conductive pads or metal bumps on a surface of a wafer or chip to transfer electrical signals.

Pitches of the conductive pads or metal bumps are reduced to fulfill scale-down requirement of the integrated circuit. For example, size of each of conductive pads on a wafer or chip to be test may be reduced to approximately 40 micrometer (m), which implies each of the probe pins may have a maximum size of approximately 40 μm. Accordingly, each of apertures of a probe head receiver may have a maximum size of 60 μm to make sure each of the probe pins may pass each aperture. Moreover, distance where each probe pin travels during assembling is relatively greater than the size of each aperture.

It may take at least 35 labor days to manually assemble a probe card assembly having 25,000 probe pins, where each probe pin is manually inserted into each aperture of a probe head receiver. Automatic insertion of probe pins into apertures of a probe head receiver may reduce manufacturing time of the probe card assembly, however, misalignment of even one probe pin to a corresponding aperture may result in failure of the probe card assembly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 illustrates a space transformer in accordance with some embodiments of the present disclosure.

FIG. 9 illustrates another operation of assembling a probe head receiver and a space transformer in accordance with some embodiments of the present disclosure.

DETAILED DESCRIPTION

Figure 1:
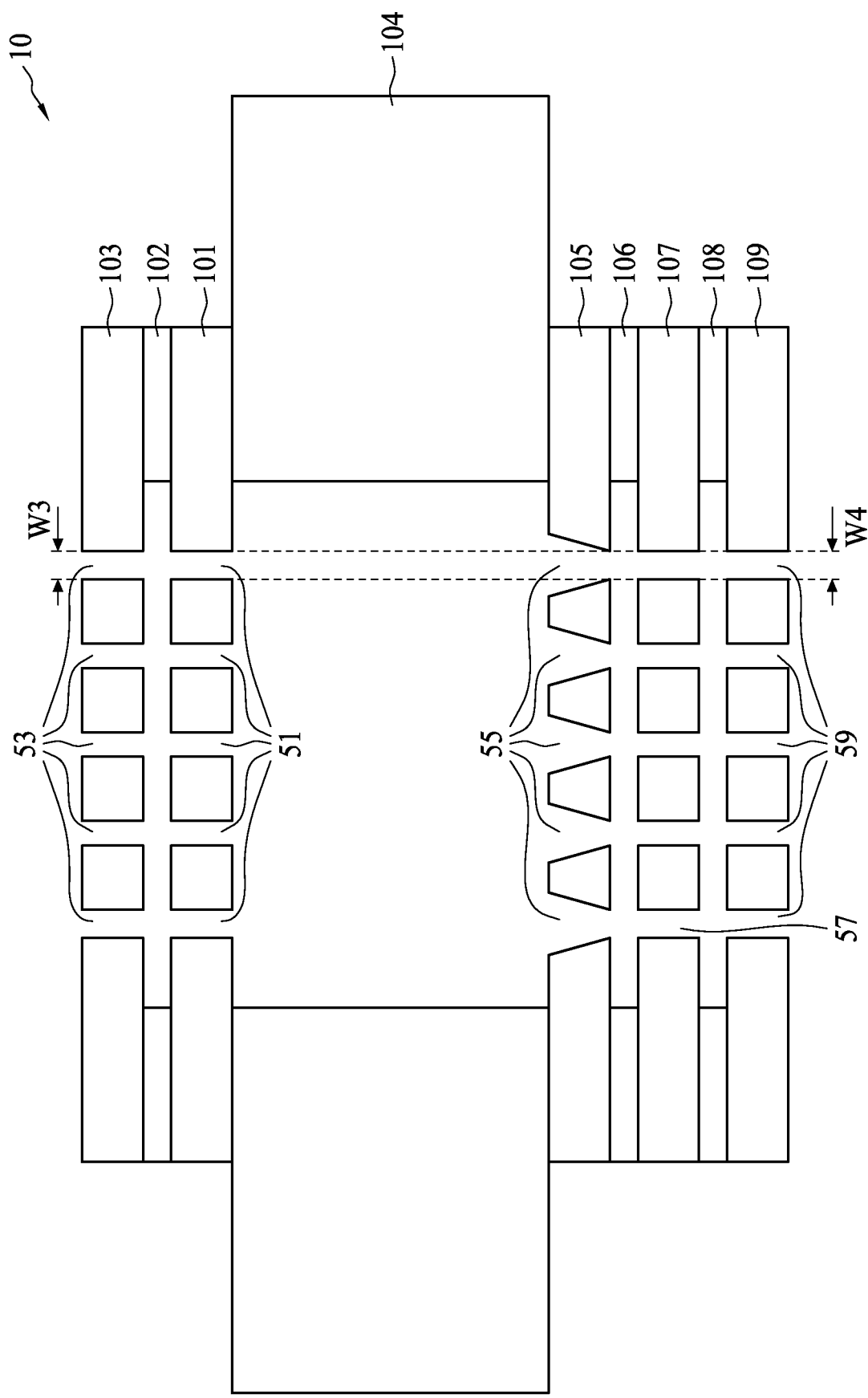
FIG. 1 illustrates a probe head receiver in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It would be desired to have a probe card assembly of relatively less manufacturing time.

FIG. 1 illustrates a probe head receiver in accordance with some embodiments of the present disclosure.

Referring to FIG. 1, a probe head receiver 10 may include a template 101, a connection element 102, a template 103, a spacer 104, a guide plate 105, a connection element 106, a template 107, connection element 108 and a template 109.

The templates 101, 103, 107 and 109, the guide plate 105 and the spacer 104 may have a variety of shapes and dimensions, depending upon a design of request. For example, the templates 101, 103, 107 and 109, the guide plate 105 and the spacer 104 may be rectangular or circular in shape, or may have irregular shapes.

An example range of thickness for each of the templates 101, 103, 107 and 109 is about 250 micrometers (μm) to about 675 μm, where the term thickness as related to the templates 101, 103, 107 and 109 indicates a vertical dimension in the context of FIG. 1. The thickness of each of the templates 101, 103, 107 and 109 is about 500 μm.

The templates 101 and 103 are disposed on the spacer 104. The templates 101 and 103 are secured by connection elements 102. The connection elements 102 may include, for example, pins, clamps, or the like. The template 101 and the spacer 104 may be secured by other connection elements (not shown in FIG. 1) similar or the same to the connection elements 102.

Template 101 includes a number of apertures 51. The apertures 51 may be a number of through holes formed in the template 101. The apertures 51 may be rectangular or circular in shape but may be varied in accordance with some other embodiments of the present disclosure. An example range of size or width of the apertures 51 is about 50 ƒm to about 70 µm, where the term size or width as related to the apertures 51 indicates a horizontal dimension in the context of FIG. 1. The size or width of the apertures 51 is about 60 µm. The size or width of the apertures 51 is about 55 µm. Each of the apertures 51 of the template 101 has a width W3 on a top surface (not denoted in FIG. 1) of the template 101 and a width W4 on a bottom surface (not denoted in FIG. 1) of the template 101, wherein the width W3 is substantially the same as the width W4.

The template 103 includes a number of apertures 53. The apertures 53 may be a number of through holes formed in the template 103. The number of the apertures 51 may be the same with the number of the apertures 53. Each of the number of apertures 51 is aligned with each of the number of apertures 53. The apertures 53 are aligned to respective apertures 51. The apertures 53 may have a shape and a size similar or the same to those of the apertures 51.

Example materials for the templates 101 and 103 may include, without limitation, silicon, silicon nitride, plastic and quartz.

The spacer 104 is disposed between the template 101 and the guide plate 105. Example materials for the spacer 104 may include, without limitation, metals, such as steel, or other rigid materials that have good flatness and provide stability for the template 101 and the guide plate 105. An example range of thickness for the spacer 104 is about 3 millimeters (mm) to about 5 mm. The thickness of the spacer 104 is about 4 mm.

The guide plate 105 is disposed under the spacer 104. The guide plate 105 and the spacer 104 may be secured by connection elements (not shown in FIG. 1) similar to the connection elements 102. An example range of thickness for the guide plate 105 is about 250 µm to about 675 µm. The thickness of the guide plate 105 is about 500 µm. Example materials for the guide plate 105 may include, without limitation, ceramic, FR4, polyimide or the like.

The guide plate 105 includes a number of apertures 55. The apertures 55 may be a number of through holes formed in the guide plate 105. The number of the apertures 55 may be the same with the number of the apertures 51. Each of the number of apertures 55 is aligned with each of the number of apertures 51. The apertures 55 are aligned to respective apertures 51. The apertures 55 may have a shape different from that of the apertures 51 and 53. Apertures 55 may have a size different from that of the apertures 51 and 53. Details of the guide plate 105 may further be described with reference to FIG. 2 below.

Figure 2:
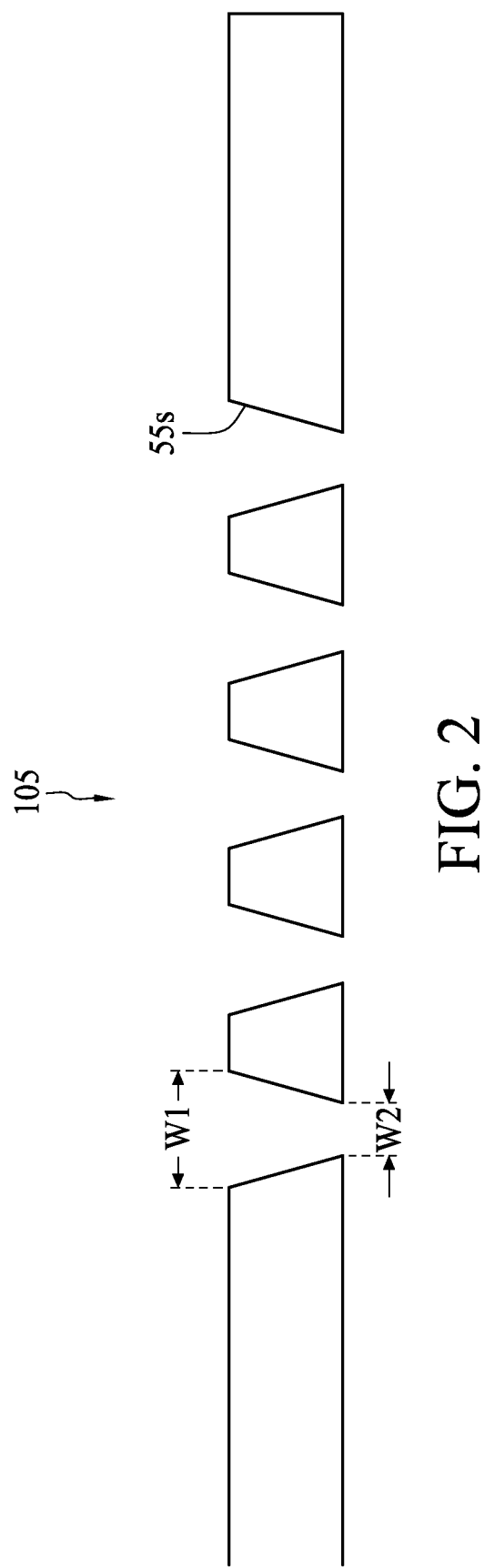
FIG. 2 illustrates a guide plate in accordance with some embodiments of the present disclosure.

FIG. 2 illustrates a guide plate in accordance with some embodiments of the present disclosure.

Referring to FIG. 2, which shows an enlarged view of the guide plate 105. Each of the apertures 55 formed in the guide plate 105 may be a funnel in shape. Each of the apertures 55 extends from a top surface (not denoted in FIG. 2) to a bottom surface (not denoted in FIG. 2) of the guide plate 105. Each of the apertures 55 may have a size or a width which tapers downward. Each of the apertures 55 has a width W1 on the top surface (not denoted in FIG. 2) of the guide plate 105 and a width W2 on the bottom surface (not denoted in FIG. 2) of the guide plate 105, wherein the width W1 is greater than the width W2. The width W2 as shown in FIG. 2 is substantially the same as the width W3 as shown in FIG. 1. Each of the apertures 55 is defined by a sidewall 55s. Size of each of the apertures 55 is greater than that of each of the apertures 51. The width W1 is greater than the width W2 by approximately 13 to 14 µm. The width W1 is greater than the width W2 by approximately 15 µm.

Referring back to FIG. 1, the template 107 is disposed under the guide plate 105. The template 107 and the guide plate 105 are secured by the connection elements 106, which may be similar or the same to the connection elements 102. The template 107 includes a number of apertures 57. The apertures 57 may be a number of through holes formed in the template 107. The number of the apertures 57 may be the same with the number of the apertures 55. Each of the number of apertures 57 is aligned with each of the number of apertures 55. The apertures 57 are aligned to respective apertures 55. The apertures 57 may have a shape and a size similar or the same to those of the apertures 51. The template 107 may include materials similar or the same to those of the template 101.

The template 109 is disposed under the template 107. The template 109 and the template 107 are secured by connection elements 108, which may be similar or the same to the connection elements 102. The template 109 includes a number of apertures 59. The apertures 59 may be a number of through holes formed in the template 109. The number of the apertures 59 may be the same with the number of the apertures 57. Each of the number of apertures 59 is aligned with each of the number of apertures 57. The apertures 59 are aligned to respective apertures 57. The apertures 59 may have a shape and a size similar or the same to those of the apertures 51. The template 109 may include materials similar or the same to those of the template 101.

Figure 3:
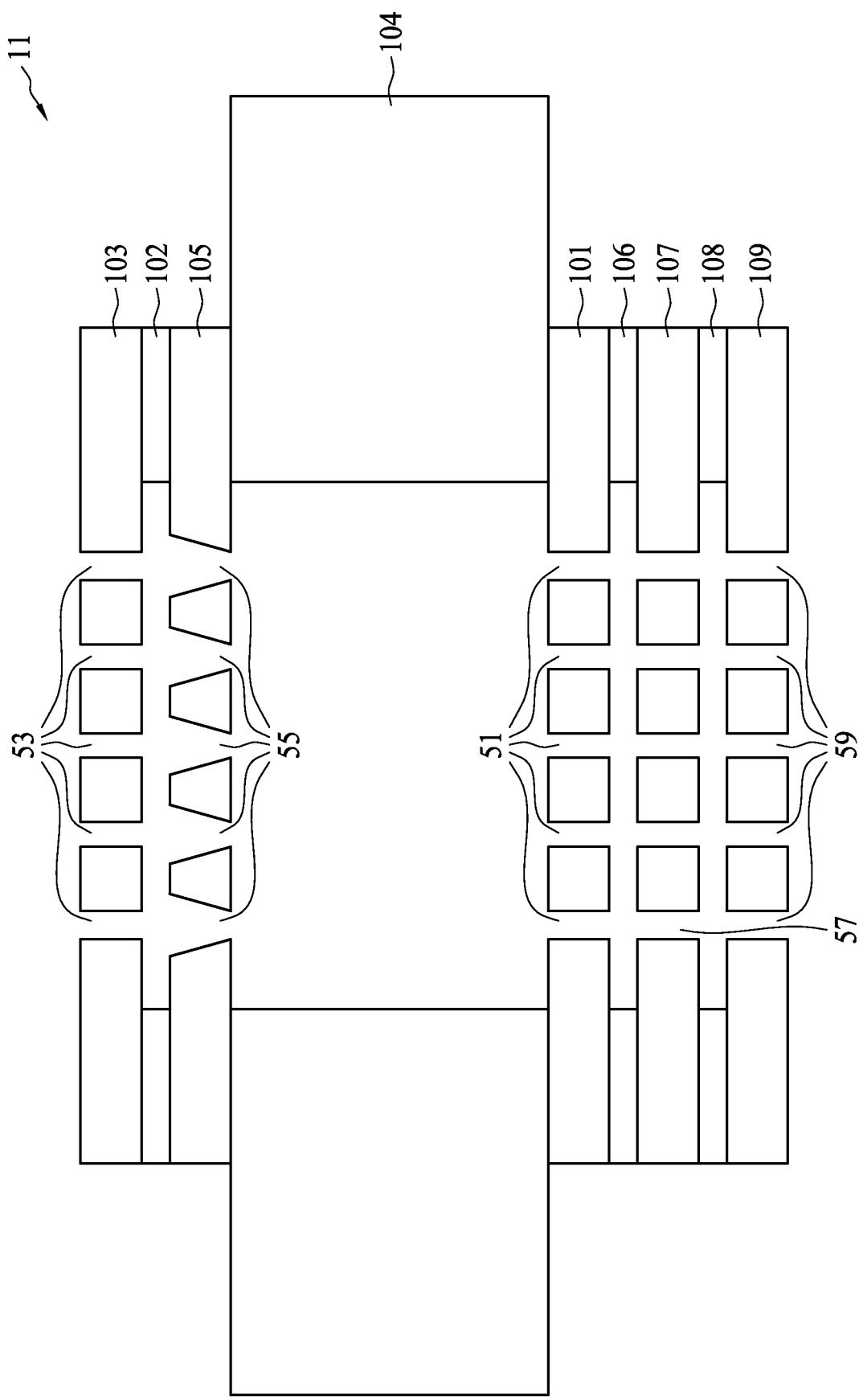
FIG. 3 illustrates another probe head receiver in accordance with some embodiments of the present disclosure.

FIG. 3 illustrates another probe head receiver in accordance with some embodiments of the present disclosure.

Referring to FIG. 3, probe head receiver 11 may be similar to the probe head receiver 10 as described and illustrated with reference to FIG. 1, except that the guide plate 105 and the template 101 are swapped or exchanged. The guide plate 105 is disposed over the spacer 104. The template 103 is disposed over the guide plate 105. The guide plate 105 is disposed between the template 103 and the spacer 104.

Figure 4:
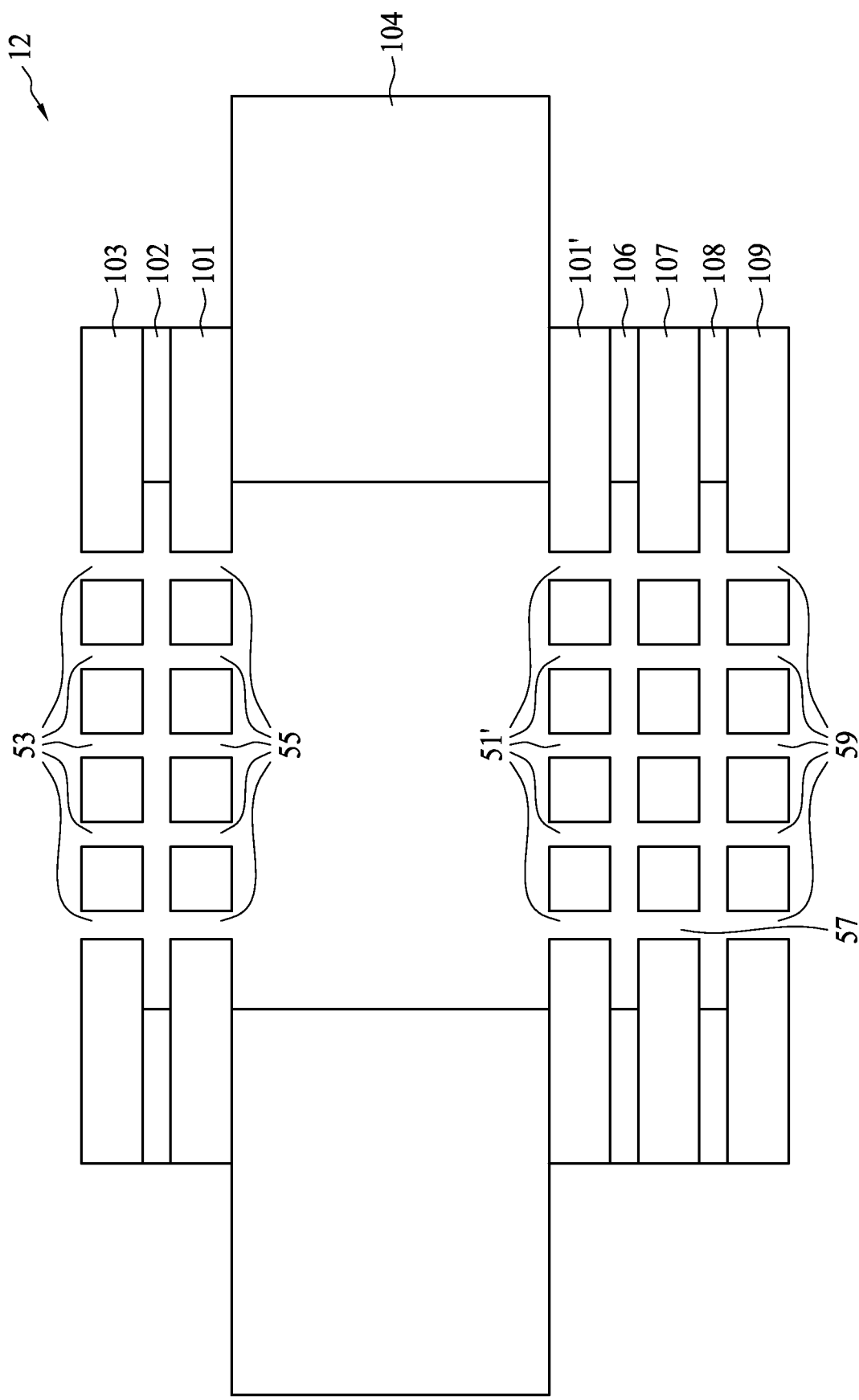
FIG. 4 illustrates another probe head receiver in accordance with some embodiments of the present disclosure.

FIG. 4 illustrates another probe head receiver in accordance with some embodiments of the present disclosure.

Referring to FIG. 4, probe head receiver 12 is similar to the probe head receiver 10 as described and illustrated with reference to FIG. 1, except that the guide plate 105 is replaced by a template 101'. The template 101' may have a structure similar or the same to the template 101.

FIG. 5 illustrates a space transformer in accordance with some embodiments of the present disclosure.

Referring to FIG. 5, a space transformer 20 may include a space transformer plate 120, a printed circuit board (PCB) 140, fixing rings 110 and probe pins 130.

The space transformer plate 120 may include, for example but is not limited to, a substrate 120. The substrate 120 includes contact pads 121. The substrate 120 is bonded to the PCB 140 through flip-chip bonding, with solder balls 122 therebetween. It is contemplated that the space transformer plate 120 may include other types of carriers (not shown in FIG. 5), which may be attached to the PCB 140 by adhesive and the contact pads 121 may be electrically connected to the PCB 140 by wires. Metal lines and vias (not shown in FIG. 5) are formed in the substrate 120, so that the solder balls 122 may have greater pitches than the contact pads 121 on the substrate 120.

The contact pads 121 are configured to have the same pitch as the probe pins 130, so that they can physically contact probe pins 130 when the probe pins 130 are in contact with the contact pads of the device under test (DUT, not shown), the contact pads of the DUT have an electrical connection to the solder balls 122, which connect the PCB 140 to the space transformer plate 120. The DUT may include integrated circuits formed on a wafer. The contact pads 121 may include, for example, aluminum (Al), copper (Cu), gold (Au) or a mixture, an alloy, or other combination thereof.

Fixing rings 110 are secured on the PCB 140. Each or the fixing rings 110 has opening(s) 111.

The probe pins 130 are configured to have the same pitch as apertures 51, 53, 55, 57 and 59 as described and illustrated with reference to FIG. 1. An example range of size or width of the probe pins 130 is about 35 µm to about 45 µm where the term size or width as related to the probe pins 130 indicates a horizontal dimension in the context of FIG. 5. The size or width of the probe pins 130 is about 40 µm. An example range of the pitch of the probe pins 130 is about 35 µm to about 45 µm. The pitch of the probe pins 130 is about 40 µm. The probe pins 130 may include, for example, but is not limited to 27,000 pins formed in a matrix. The probe pins 130 are formed of conductive materials such as metals.

Figure 5C:
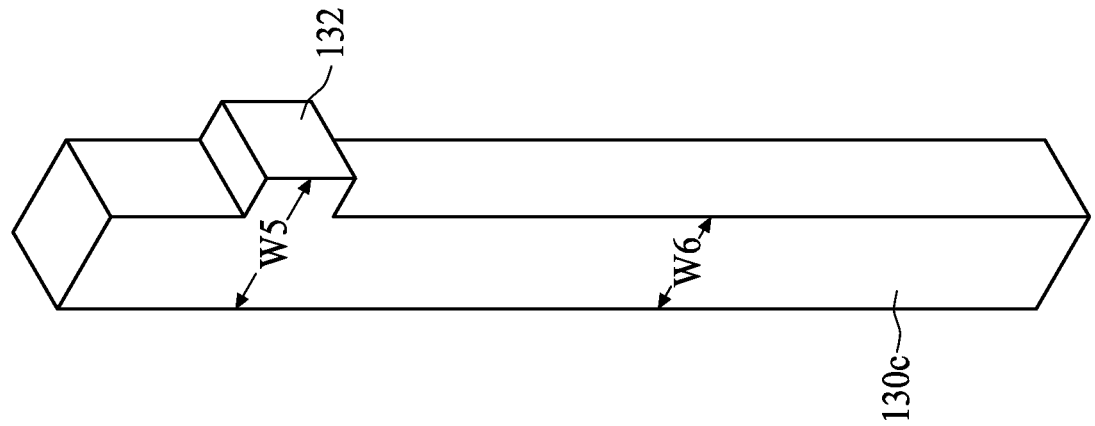
FIG. 5C illustrates another probe pin in accordance with some embodiments of the present disclosure.
Figure 5B:
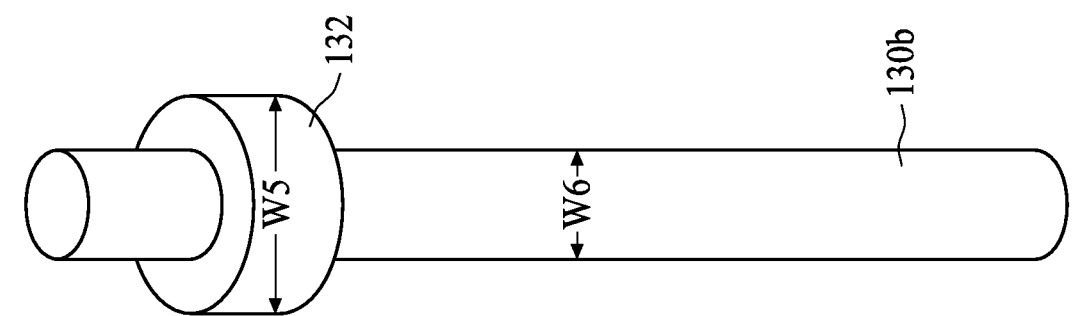
FIG. 5B illustrates another probe pin in accordance with some embodiments of the present disclosure.
Figure 5A:
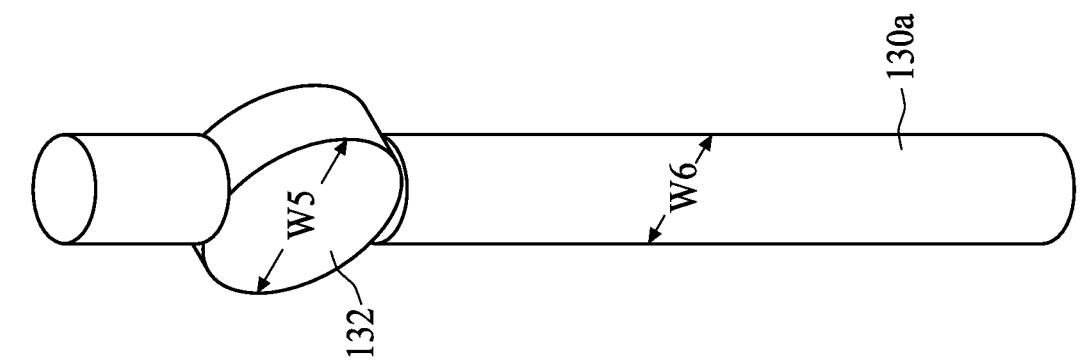
FIG. 5A illustrates a probe pin in accordance with some embodiments of the present disclosure.

FIG. 5A illustrates a probe pin in accordance with some embodiments of the present disclosure.

Referring to FIG. 5A, the probe pin 130a is attached with one probe pin stopper 132, which has lateral size W5 greater than lateral size W6 of the respective probe pin 130a. The probe pin stopper 132 may be coated on the probe pin 130a, and may be formed of a conductive or a dielectric material.

FIG. 5B illustrates another probe pin in accordance with some embodiments of the present disclosure.

Referring to FIG. 5B, probe pin stopper 132 is a compressed portion of probe pin 130b, and hence is formed of a same material as probe pin 130b. In FIGS. 5A and 5B, the probe pins 130a and 130b may have circular cross-sectional views.

FIG. 5C illustrates another probe pin in accordance with some embodiments of the present disclosure.

Referring to FIG. 5C, probe pin 130c may have a rectangular (such as a square) cross-sectional view (a top view or a bottom view), and probe pin stopper 132 may be plated on the probe pin 130c. In an embodiment, an entirety (except the portion on which probe pin stopper 132 is formed or attached) of one probe pin 130c has a uniform lateral dimension W6 and a uniform cross-sectional shape. In accordance with some other embodiments, different portions of the probe pin 130c may have different lateral dimensions.

Figure 6:
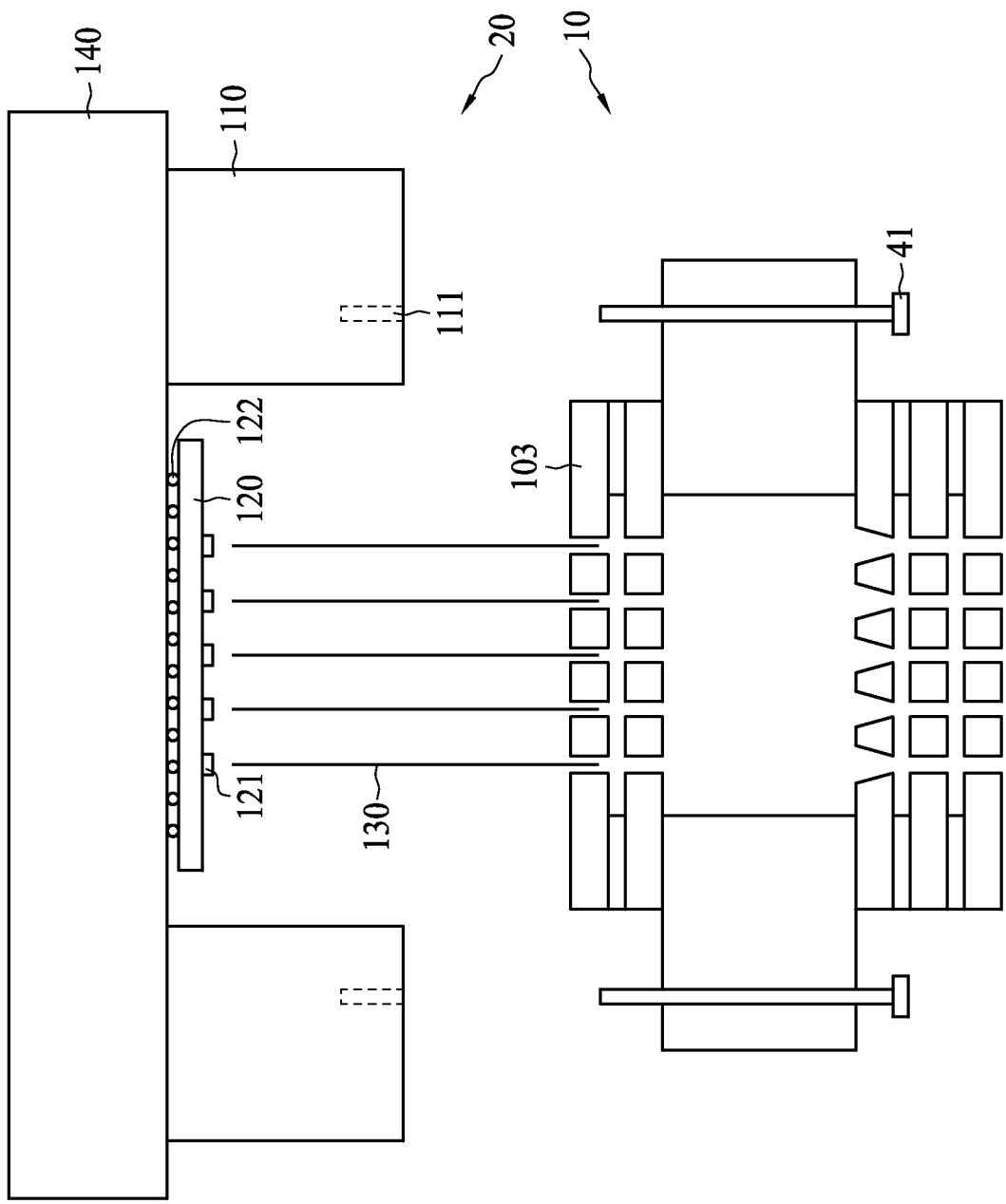
FIG. 6 illustrates an operation of assembling a probe head receiver and a space transformer in accordance with some embodiments of the present disclosure.

FIG. 6 illustrates an operation of assembling a probe head receiver and a space transformer in accordance with some embodiments of the present disclosure.

Referring to FIG. 6, the probe pins 130 are to be inserted the probe head receiver 10. Each the probe pins 130 has to in turn pass the apertures 53, 51, 55, 57 and 59 such that the probe pin stopper 132 (not shown in FIG. 6) formed on each the probe pins 130 may support the probe pins 130 on a top surface (not denoted in FIG. 6) of the template 103. Each the probe pins 130 has to in turn pass the apertures 53, 51, 55, 57 and 59 such that the openings 111 formed in the fixing rings 110 may receive secure pins 41 to secure the probe head 10 structure to the fixing rings 110.

Figure 8:
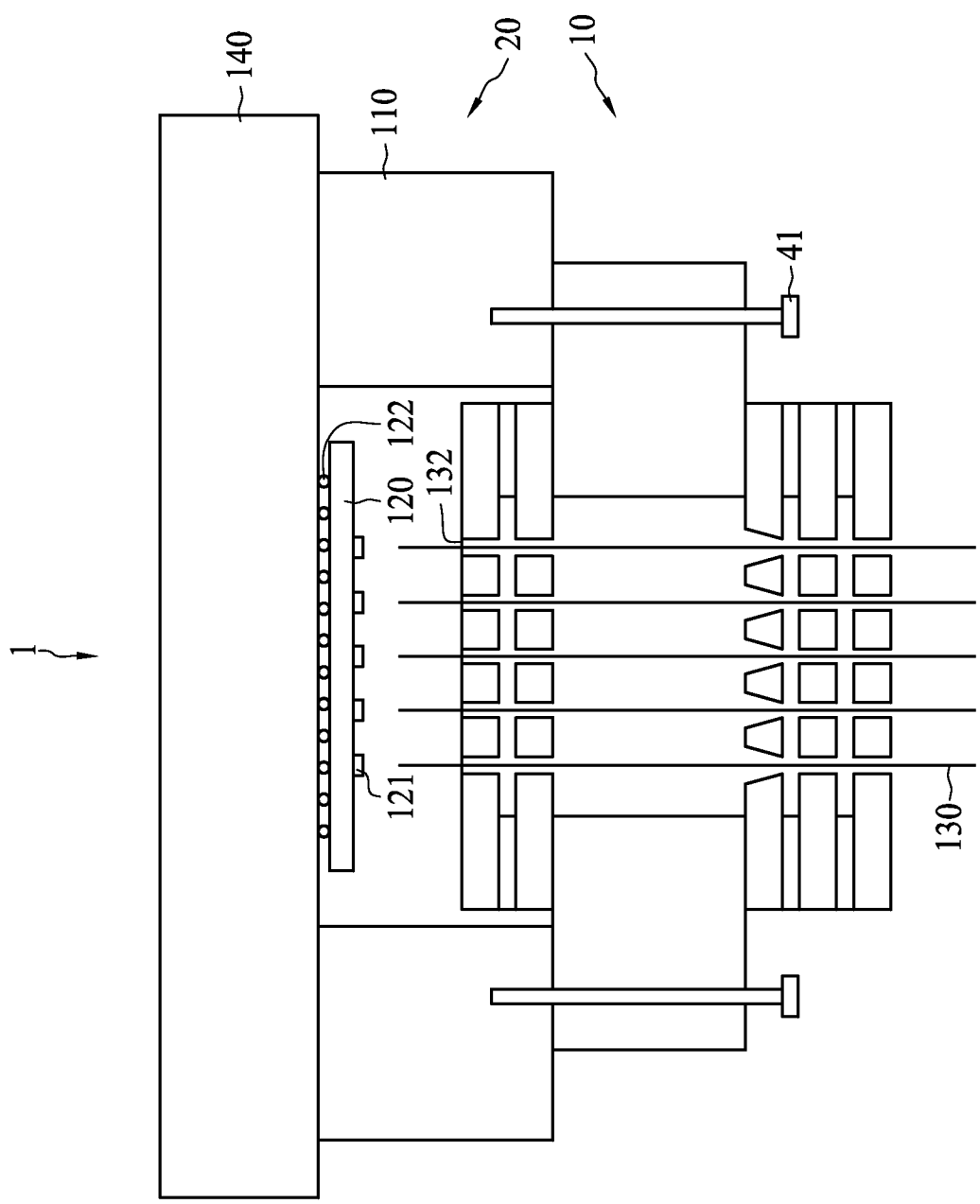
FIG. 8 illustrates a probe card assembly in accordance with some embodiments of the present disclosure.

FIG. 8 illustrates a probe card assembly in accordance with some embodiments of the present disclosure.

Referring to FIG. 8, a probe card assembly 1 may include the probe head receiver 10 and the space transformer 20. Once the probe pins 130 are precisely pass the apertures 53, 51, 55, 57 and 59 as shown in FIG. 6, which implies that the probe pins 130 are well aligned to the respective apertures 53, 51, 55, 57 and 59, the probe pin stopper 132 formed on each the probe pins 130 may support each the probe pin 130 on the top surface (not denoted in FIG. 8) of the template 103. The secure pins 41, which may pass through holes formed in the spacer 104, may be received by the openings 111 formed in the fixing rings 110 to secure the probe head receiver 10 to the space transformer 20 to form the probe card assembly 1.

The probe card assembly 1 includes a template 101, a connection element 102, a template 103, a spacer 104, a guide plate 105, a connection element 106, a template 107, connection element 108, a template 109, a space transformer plate 120, a printed circuit board (PCB) 140, fixing rings 110 and probe pins 130. The PCB 140 provides electrical connections to test equipment and the space transformer plate 120 provide electrical connections between the PCB 140 and the probe head receiver 10, which may be smaller than the space transformer 20. Space transformer plate 120 may be made as a single layer of material or from multiple layers. For example, the space transformer plate 120 may be a multi-layer ceramic (MLC). In accordance with some other embodiments of the present disclosure, the space transformer plate 120 may be a Multi-Layer Silicon (MLS) space transformer plate 120 made using silicon wafer fabrication techniques. An MLS space transformer plate 120 may provide finer contact pitch, as compared to an MLC space transformer plate 120.

The probe head receiver 10 supports a plurality of the probe pins 130 that make contact with a device under test (not shown in FIG. 8). The probe pins 130 extend through the apertures 55 in the guide plate 105 and through the apertures 53, 51, 57 and 59 in the templates 103, 101, 107 and 109 and make contact with the contact pads 121 on the space transformer plate 120 when the probe pins 130 are in contact with the contact pads of the DUT (not shown in FIG. 8). Examples of contact pads 121 include, without limitation, pads and stud bumps.

The templates 103, 101, 107 and 109 and the guide plate 105 position and align the probe pins 130 to match a pattern of desired contact pads on a device under test. The spacer 104 provide a desired spacing between the template 101 and the guide plate 105 and may also be used to attach the probe head receiver 10 to the space transformer 20. The template 103 may be attached directly to the space transformer 20, e.g., by bonding, or may be spaced apart from the space transformer 20 as depicted in FIG. 8, depending upon a particular implementation. Other structures, e.g., a fastener structure, may be used to hold probe head receiver 106 in position with respect to space transformer 20 that are not depicted in FIG. 8 for purposes of explanation.

According to some embodiments of the present disclosure, the template 103, 101, 107 and 109 and/or the guide plate 105 are made from a rigid material to provide adequate alignment and thermal stability of the probe pins, to ensure proper contact with a device under test. One or more portions or the entirety of t the template 103, 101, 107 and 109 and/or the guide plate 105 may be coated, for example, with a non-conductive material. Example non-conductive materials include, without limitation, insulating coating materials such as silicon dioxide (SiO2), rubber and other non-conductive materials. The use of non-conductive material in the apertures 53, 51, 57, 59 and 55 of the template 103, 101, 107 and 109 and the guide plate 105 prevents shorts between the probe pins 130 if the guide plate material is not sufficiently insulating.

Figure 7:
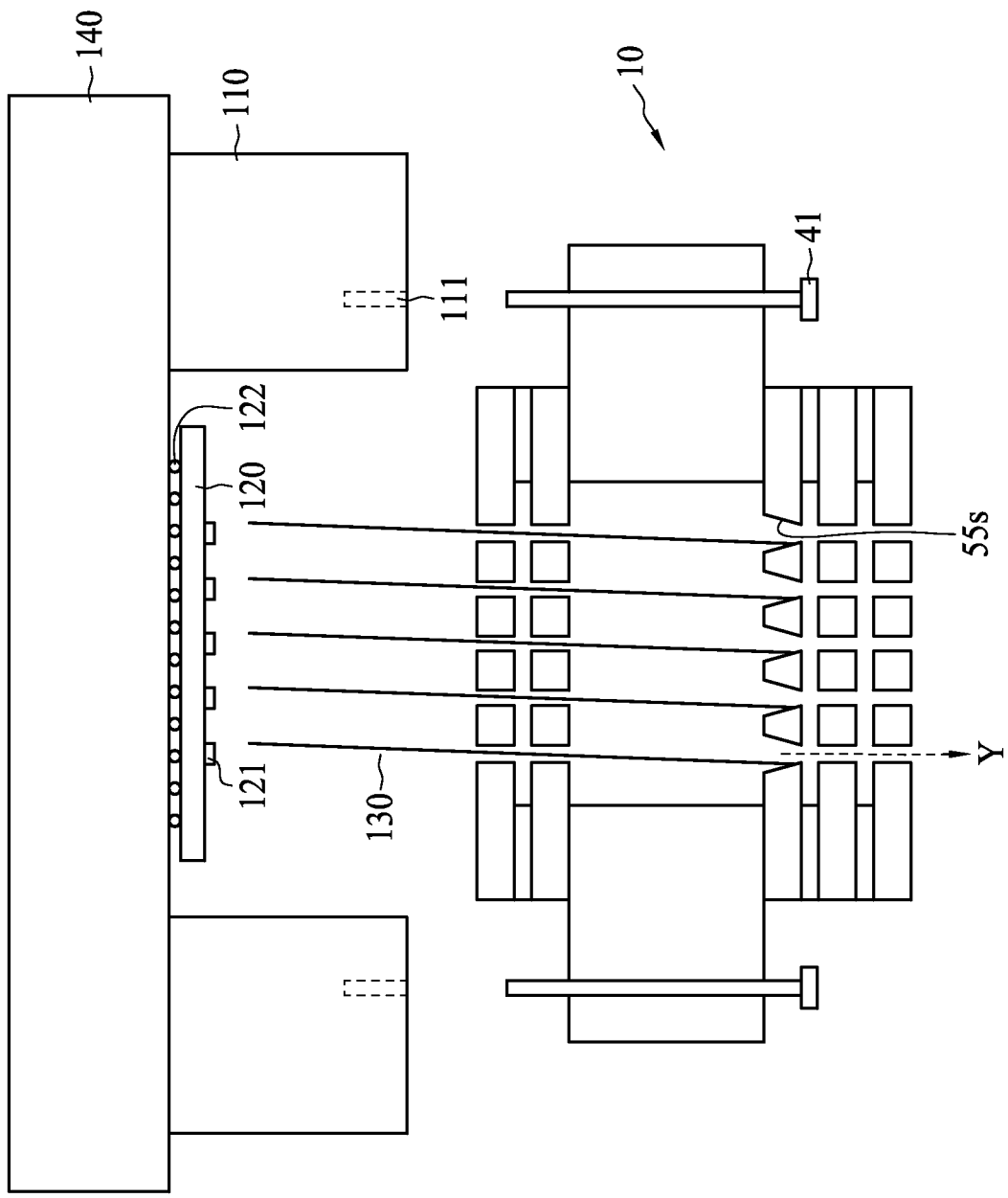
FIG. 7 illustrates another operation of assembling a probe head receiver and a space transformer in accordance with some embodiments of the present disclosure.

FIG. 7 illustrates another operation of assembling a probe head receiver and a space transformer in accordance with some embodiments of the present disclosure.

Referring to FIG. 7, which illustrates another operation of assembling the probe head receiver 10 and the space transformer 20 under a condition that any of the probe pins 130 is misaligned to any of the apertures 53, 51. If the probe pins 130 are deflected or misaligned during an insertion operation, the probe pins 130 may still pass the apertures 53 and 51 due to a relatively short distance therebetween, however, while the probe pins 130 keep traveling in a deflected direction in a relatively long spacing of the spacer 104, the probe pins 130 may not pass the apertures 55 of the guide plate 105 and may contact the side walls 55s of the apertures 55.

The side walls 55s of the apertures 55 are capable of directing the probe pins 130 from the deflected direction to another direction (e.g. the direction "Y" shown in dotted line in FIG. 7) different from the deflected direction, such that the probe pins 130 may goes back to pass through the apertures 55, 57 and 59 to perform the assembly operation to form the probe card assembly 1 as shown in FIG. 8. Thanks to the design of the guide plate 105, to auto insert a number of 27,000 probe pins to the probe head receiver 10 may take approximately 8 labor days.

FIG. 9 illustrates another operation of assembling a probe head receiver and a space transformer in accordance with some embodiments of the present disclosure.

Referring to FIG. 9, which illustrates another operation of assembling the probe head receiver 12 (as shown in FIG. 4) and the space transformer 20 under a condition that any of the probe pins 130 is misaligned to any of the apertures 53, 51. If the probe pins 130 are deflected or misaligned during an insertion operation, the probe pins 130 may still pass the apertures 53 and 51 due to a relatively short distance therebetween, however, while the probe pins 130 keep traveling in a deflected direction in a relatively long spacing of the spacer 104, the probe pins 130 may not pass the apertures 51' of the template 101' and may contact the top surface (not denoted in FIG. 9) of the template 101'. The top surface (not denoted in FIG. 9) of the template 101' may not function to direct the probe pins 130 back to pass the apertures 51' but may rather damage the probe pins 130.

A force detector may be disposed on an auto pin-installer to insert the probe pins 130 to the probe head receivers 10, 11 and 12 as shown in FIGS. 1, 3 and 4. The force detector may detect whether a force, e.g. a downward force, exceeds a predetermined value or a threshold, for example, 5 g. If the force detected is greater than the threshold, the auto pin-installer may stop the insertion operation and lift the probe pins 130 to avoid damage.

In accordance with some embodiments of the present disclosure, a probe head receiver includes: a first template, a guide plate and a spacer. The first template has a number of apertures of a first size. The guide plate has a number of apertures of a second size, each of the number of apertures of the first template is aligned with each of the number of apertures of the guide plate. The spacer is between the first template and the guide place. The second size is different from the first size.

In accordance with some embodiments of the present disclosure, a probe head receiver includes: a guide plate, a first template and a spacer. The guide plate has a number of sidewalls to direct an object from a first direction to a second direction different from the first direction. Each of the number of sidewalls defines an aperture. The first template has a number of apertures. Each of the number of apertures of the first template is aligned with each of the number of apertures of the guide plate. The spacer is between the first template and the guide place.

In accordance with some embodiments of the present disclosure, a probe card assembly includes a probe head receiver and a number of probe pins. The probe head receiver includes a first template, a guide plate and a spacer. The first template has a number of apertures. The guide plate has a top surface and a bottom surface and a number of funnel-shape apertures formed therein. The funnel-shape apertures extend from the top surface to the bottom surface of the guide plate. The spacer is between the first template and the guide place. Each the number of probe pins passes through each of the number of apertures of the first template and through each of the number of funnel-shape apertures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A probe head receiver, comprising:
a first template having a number of apertures of a first size;
a guide plate having a number of apertures;
a second template separated from the first template by the guide plate and having a number of apertures, each of the number of apertures of the second template being aligned with each of the number of apertures of the first template;
a third template having a number of apertures of the first size, wherein the first template is disposed between the third template and the guide plate;
a spacer between the first template and the guide plate, wherein the spacer has a first surface facing the first template and exposed through the first template to be secured to a fixing ring;
a first connection element securing the third template to the first template; and
a second connection element securing the second template to the guide plate,
wherein each of the number of apertures of the guide plate has a first side facing the first template and a second side facing the second template, the first side has a second size, the second side has a third size, the third size is substantially equal to the first size, and the second size is greater than the first size and the third size.

2. The probe head receiver of claim 1, wherein the guide plate is under the spacer.

3. The probe head receiver of claim 2, wherein the second template is under the guide plate.

4. The probe head receiver of claim 1, wherein a width of each of the number of apertures of the guide plate is tapering downward.

5. The probe head receiver of claim 1, wherein the second size is greater than the first size by approximately 15 micrometers.

6. The probe head receiver of claim 1, wherein the guide plate comprises one of ceramic, FR4 or polyimide.

7. A probe head receiver, comprising:
a guide plate having a number of sidewalls to direct an object from a first direction to a second direction different from the first direction, each of the number of sidewalls defining an aperture;

a first template having a number of apertures of a first size;

a second template separated from the first template by the guide plate and having a number of apertures, each of the number of apertures of the second template being aligned with each of the number of apertures of the first template;

a third template having a number of apertures of the first size, wherein the first template is disposed between the third template and the guide plate;

a first connection element securing the third template to the first template;

a second connection element securing the second template to the guide plate; and a spacer between the first template and the guide plate, wherein each of the number of apertures of the guide plate has a first side facing the first template and a second side facing the second template, the first side has a second size, the second side has a third size, the third size is substantially equal to the first size, the second size is greater than the first size and the third size, and the spacer has a surface facing the first template and exposed through the first template to be secured to a fixing ring.

8. The probe head receiver of claim 7, wherein the guide plate is under the spacer.

9. The probe head receiver of claim 8, wherein the second template is under the guide plate.

10. The probe head receiver of claim 7, wherein the guide plate comprises one of ceramic, FR4 or polyimide.

11. A probe card assembly, comprising:

a probe head receiver comprising:

a first template having a number of first apertures of a first size;

a second template having a number of second apertures;

a guide plate between the first template and the second template and having a top surface and a bottom surface and a number of funnel-shape apertures formed therein and extending from the top surface to the bottom surface;

a third template having a number of second apertures of the first size, wherein the first template is disposed between the third template and the guide plate;

a first connection element securing the third template to the first template; and a second connection element securing the second template to the guide plate;

a spacer between the first template and the guide plate and having a surface facing the first template and exposed through the first template to be secured to a fixing ring; and a number of probe pins, each the number of probe pins passing through each of the number of first apertures of the first template and through each of the number of funnel-shape apertures;

wherein each of the funnel-shape apertures of the guide plate has a first side facing the first template and a second side facing the second template, the first side has a second size, the second side has a third size, the third size is substantially equal to the first size, and the second size is greater than the first size and the third size.

12. The probe head receiver of claim 7, wherein the object is directed to pass through each of the number of apertures of the guide plate and each of the number of the apertures of the second template.

13. The probe head receiver of claim 1, wherein each of the number of apertures of the second template has a fourth size on a top surface of the second template and a fifth size on a bottom surface of the second template, wherein the fourth size is substantially the same as the fifth size.

14. The probe head receiver of claim 7, wherein a width of the number of apertures of the first template is substantially the same as a width of the number of apertures of the second template.

15. The probe head receiver of claim 13, wherein the first size of the number of apertures of the first template is substantially the same as the fourth size of the number of apertures of the second template.

16. The probe head receiver of claim 13, wherein the second size is greater than the fourth size by approximately 15 micrometers.

17. The probe head receiver of claim 1, wherein the number of the apertures of the first template is the same as the number of the apertures of the second template.

18. The probe head receiver of claim 1, wherein the number of the apertures of the guide plate is the same as the number of the apertures of the first template and the number of the apertures of the second template.

19. The probe head receiver of claim 1, wherein the shape of the number of the apertures of the first template is the same as the shape of the number of the apertures of the second template.

20. The probe head receiver of claim 1, wherein the first template is disposed over the first surface of the spacer and the second template is disposed over a second surface of the spacer opposite to the first surface.

* * * * *